United States Patent [19]
Peng et al.

[11] Patent Number: 5,461,582
[45] Date of Patent: Oct. 24, 1995

[54] FILTER FOR 2B1Q SIGNALS

[75] Inventors: Yung-Chow Peng; Ta-Cheng Hsiung, both of Chutung, Taiwan

[73] Assignee: Industrial Technology Research Institute, Hsinchu, Taiwan

[21] Appl. No.: 213,861

[22] Filed: Mar. 16, 1994

[51] Int. Cl.[6] .................................................. G06F 17/10
[52] U.S. Cl. ................... 364/724.16; 364/750.5; 370/32.1
[58] Field of Search .................... 364/724.16, 724.13, 364/750.5; 370/32.1

[56] References Cited

U.S. PATENT DOCUMENTS

| | | | |
|---|---|---|---|
| 4,785,445 | 11/1988 | Guidoux | 370/32.1 |
| 4,926,472 | 5/1990 | Batruni et al. | 364/724.16 |
| 4,931,980 | 6/1990 | Rault | 364/724.16 |
| 5,249,179 | 9/1993 | Koyama | 370/32.1 |
| 5,287,299 | 2/1994 | Lin | 364/750.5 |
| 5,297,069 | 3/1994 | Asato et al. | 364/724.16 |

*Primary Examiner*—David H. Malzahn
*Attorney, Agent, or Firm*—Meltzer, Lippe, Goldstein et al.

[57] ABSTRACT

A filter is disclosed for filtering 2B1Q coded symbols from the set (−3, −1, +1, +3) to obtain convolutions of the form $$\sum_j a_j q(n-j)$$

without any multiplications by three. The convolution is obtained by using two accumulators to separately accumulate coefficients $a_j$ where the corresponding symbol has a magnitude one and where the corresponding symbol has a magnitude three.

9 Claims, 4 Drawing Sheets

FILTER FOR 2B1Q SIGNALS

FIELD OF THE INVENTION

The present invention relates to a filter for filtering 2B1Q coded signals. The inventive filter is especially useful as an echo canceller or channel equalizer in a communications system using 2B1Q coding for the transmission of information.

BACKGROUND OF THE INVENTION

In high-speed data transmission applications over telephone twisted pair cable, the requirement for a low error rate is essential to the stable operation of the communications channel. When digital data is transmitted at a high rate over a telephone line, the main impairments are attenuation, dispersion and crosstalk noise. In addition, when signal transmission is fully duplex, the echo signal originating from the transmitter interferes with the data being received.

An example of a high speed data transmission application is the digital subscriber loop in the evolving Integrated Services Digital Network (ISDN).

The required data transmission rate over digital subscriber lines in the ISDN is 160 kbits/sec. To improve ISDN data transmission performance against the impairments mentioned above, the data to be transmitted is coded into a bandwidth-reducing format before it is transmitted.

Different modulation techniques can be employed to reduce the bandwidth of a transmitted signal. The modulation technique adopted in the United States by the American National Standard Institute (ANSI) for use over the digital subscriber line is called 2B1Q line coding. 2B1Q coding is a technique whereby a binary input sequence is transformed into a quaternary sequence by amplitude modulating pairs of bits in the binary stream of data.

According to the 2B1Q coding technique, successive pairs of binary data B=(0,1) are one-to-one mapped onto corresponding units of quaternary symbols Q=(−3, −1, +1, +3) and then transmitted as a corresponding voltage level at half the rate of the binary sequence. Therefore, an incoming binary data stream B with a bit rate of 160 kbit/sec is converted into a quaternary bit stream Q with a symbol rate of 80 kilo-symbols/sec and then transmitted. The conventional mapping rule from the binary data format to the 2B1Q data format is provided in Table 1 below.

TABLE 1

| Binary (B) | | Quaternary |
|---|---|---|
| $q_0$ | $q_1$ | (Q) |
| 1 | 1 | +1 |
| 1 | 0 | +3 |
| 0 | 1 | −1 |
| 0 | 0 | −3 |

The signal processing that is performed on a 2B1Q transmission in the data detection process is intended to remove echo interference in the received signal that is generated by the transmitter and to remove the distortion in the received signal itself. The former filtering task is referred to as echo cancellation and the latter is known as equalization.

Both echo cancellation and equalization filtering functions utilize a similar structure in that they can be performed by the same hardware configuration. One such configuration is the linear transversal filter.

A conventional linear transversal filter is shown in FIG. 1. The filter 10 of FIG. 1 performs the convolution between the transmitted signal, e.g. 2B1Q symbols q(n), where q(n) is chosen from the set (−3, −1, +1, +3) and n is a discrete time variable, and the filter's individual tap gain coefficients $a_j$, to arrive at an output y(n) where $$y(n) = \sum_{j=0}^{N} a_j q(n-j)$$

As shown in FIG. 1, a conventional transversal filter 10 comprises a delay line 12 which is formed from unit delays 13 and is tapped at intervals corresponding to the symbol width. Each tap 14 along the delay line is connected through an amplifier 16 to a summing device 18 that provides the filter output y(n).

In practice, due to the slow time variability of the echo path or communications channel, and more importantly, due to the unknown initial values for the tap gain coefficients $a_j$, an adaptive filter is required for echo cancellation and equalization.

An example of an algorithm which can be used to adapt the filter coefficients is the well known Least Mean Squares (LMS) algorithm.

A hardware implementation of the filter of FIG. 1 is shown in FIG. 2. The following notation is used in connection with the explanation of FIG. 2. For each coefficient $a_j$, $m(a_j)$ is the magnitude of $a_j$ and $s(a_j)$ is the sign of $a_j$. In addition, it should be noted (see Table 1) that for each quaternary symbol q(n−j), the first bit of the binary representation $q_o$ indicates the sign of the symbol and the second bit $q_1$ represents the magnitude. Thus, as shown in Table 1, a zero in the $q_o$ position indicates a negative sign and a one in the $q_o$ position indicates a positive sign. Similarly, a zero in the $q_1$ position indicates the magnitude is "3" and a one in the $q_1$ position indicates the magnitude is "1".

The filter 10 of FIG. 2 performs the multiplications $a_j q(n−j)$ and then sums these products to get an output y(n). Each product is $(+1)a_j$, $(+3)a_j$, $(−1)a_j$ or $(−3)a_j$. To obtain these products, the filter 10 of FIG. 2 comprises a left shift register 22 and a latch 24. The outputs of the shift register 22 and latch 24 are added by the adder 16. $m(a_j)$ is inputted into the shift register 22 and the latch 24. If $q_1=1$, then the output of the latch 24 is zero and the shift register 22 shifts by zero places. The coefficient magnitude $m(a_j)$ is then outputted by the adder 16. If $q_1=0$, then the output of the latch 24 equals its input, i.e., $m(a_j)$, and the output of the shift register 22 is its input shifted one place to the left, i.e, $2 m(a_j)$. The adder 16 adds the latch output and the shift register output to obtain $3 m(a_j)$.

The exclusive-or-gate (XOR) 18 receives $s(a_j)$ and $q_o$ as inputs. In response, the gate 18 outputs a one bit control signal $P_j$ to adder/subtractor unit 20. If $P_j=1$, the unit 20 is placed in an addition mode. If $P_j=0$, the unit 20 is placed in a subtraction mode. The output of the adder 16 is then added to or subtracted from the accumulated value of all previous products stored in the accumulator 23. In this manner, the sum is obtained.

$$\sum_j a_j q(n-j)$$

The weakness of the filter of FIGS. 1 and 2 is the difficulty of performing the multiplication by three.

A more efficient filter for use with 2B1Q symbols is disclosed in U.S. Pat. No. 4,926,472. This filter eliminates the need for multiplication by three.

According to the preferred technique, the 2B1Q signal Q=(−3, −1, +1, +3) is shifted one bit to the left to generate a corresponding shifted symbol alphabet S=(−2, 0, +2, +4). The shifted symbols are then processed through a transversal filter to produce the output y(n), where $$y(n) = \sum_{j=0}^{N} a_j s(n-j)$$

The output y(n) results from the convolution between the shifted symbols s(n) and the tap coefficients $a_j$.

By shifting the conventionally coded 2B1Q symbols to provide a new symbol alphabet comprising powers-of-two numbers, the multiplication operation in the convolution summation involves only $2a_j$ terms, rather than the potential $±3a_j$ terms normally associated with 2B1Q signal processing.

A filter which uses this technique is shown in FIG. 3. The filter 30 of FIG. 3 comprises the conventional transversal filter delay line 32 which is formed from unit delays 33, and which is tapped at intervals 34 corresponding to the symbol width. Each tap 34 along the delay line is connected through an amplifier 36 with weight $a_j$ to a summing device 38 that provides the filter output. The filter includes a DC tap 39 with a fixed input signal level of one with a tap weight $d=\Sigma a_j$ to compensate for the symbol shift.

A hardware implementation of the filter of FIG. 3 is illustrated in FIG. 4. In the discussion pertaining to FIG. 3, $s_o$, $s_1$ indicate the bits of the shifted symbols s(n−j).

The filter 40 of FIG. 4 includes the shift register 42. For each coefficient $a_j$, the quantity $m(a_j)$ is placed in the shift register 42. The multiplexer 34 receives the bits $s_o$ and $s_1$ for each shifted symbol s(n−j).

Depending on $s_0$ and $s_1$, the multiplexer 34 outputs a signal requiring a two place left shift corresponding to multiplication by 4, no shift corresponding to no multiplication, or a one place left shift corresponding to multiplication by 2 or −2. The Exclusive-or-gate 18, addition/subtraction unit 20, and accumulator 23 operate in the same manner as in the filter 10 of FIG. 2 to accumulate the filter output. A multiplexer is provided so that a term $d=\Sigma a_j$ to compensate for the symbol shift may be added to the value in the accumulator 23 to obtain the final filter output y(n).

While the filter 30 of FIGS. 3 and 4 eliminates the need for multiplication by three, the filter 30 of FIGS. 3 and 4 suffers from a disadvantage in that the symbol shifting requires a modification of the conventional LMS algorithm which is used to adapt the filter coefficients. In particular, the need to update the offset $d=\Sigma a_j$ in each cycle increases the calculation requirements of the LMS algorithm and also alters the convergence pattern of the LMS algorithm.

In view of the foregoing, it is an object of the invention to provide a filter for 2B1Q symbols which overcomes the disadvantages of the prior art filters discussed above. In particular, it is an object of the invention to provide a 2B1Q filter which requires a minimum of hardware (including no multiplexers or other structures for multiplying by three) and a minimum number of operations to obtain the filter output.

SUMMARY OF THE INVENTION

The present invention is a filter for filtering 2B1Q symbols. The filter output is given by:

$$y(n) = \sum_{j=0}^{N} a_j q(n-j)$$

Because q(n−j) can take only the values (−3, −1, +1, +3), the sum y(n) may be rewritten.

$$y(n) = y_1(n) + 3y_3(n)$$

$$y_1(n) = \sum_j a_j q(n-j) \text{ if } q(n-j) = \pm 1$$

$$3y_3(n) = \sum_j a_j q(n-j) \text{ if } q(n-j) = \pm 3$$

These expressions can be further rewritten as:

$$y_1(n) = \sum_j P_j m(a_j)$$

$$3y_3(n) = 3 \sum_j P_j m(a_j)$$

where $P_j$ indicates a plus sign or a minus sign given by $P_j=s(a_j)$ XOR $q_0$ where $s(a_j)$ is the sign of $a_j$ and $q_0$ is the sign bit of q(n−j).

A hardware circuit for implementing the inventive filter operates as follows. There are two accumulators, one accumulator for accumulating terms belonging to the sum $y_1$ and one for accumulating terms belonging to sum $Y_3$. The bit $P_j$ is determined for each coefficient $a_j$ using an exclusive or gate. The bit $P_j$ controls an addition/subtraction unit to determine whether an addition or subtraction takes place. The magnitude $m(a_j)$ of each coefficient $a_j$ is then added or subtracted to the value already stored in the $y_1$ accumulator (if the corresponding symbol has magnitude 1 as indicated by the magnitude bit) or is added or subtracted to the value already stored in the $y_3$ accumulator (if the corresponding symbol has magnitude 3). After the accumulation of all the coefficients for a cycle is completed, the contents of the $y_3$ accumulator are added to the contents of the $y_1$ accumulator three times to produce in succession $y_1+y_3$, $y_1+2y_3$, $y_1+3y_3$ which is the desired output.

This filter structure has the advantage of requiring only a small number of operations to obtain the filter output and utilizes no multiplications by three. In addition, the conventional LMS algorithm can be used to update the filter coefficients $a_j$.

DETAILED DESCRIPTION OF THE INVENTION

Figure 1:
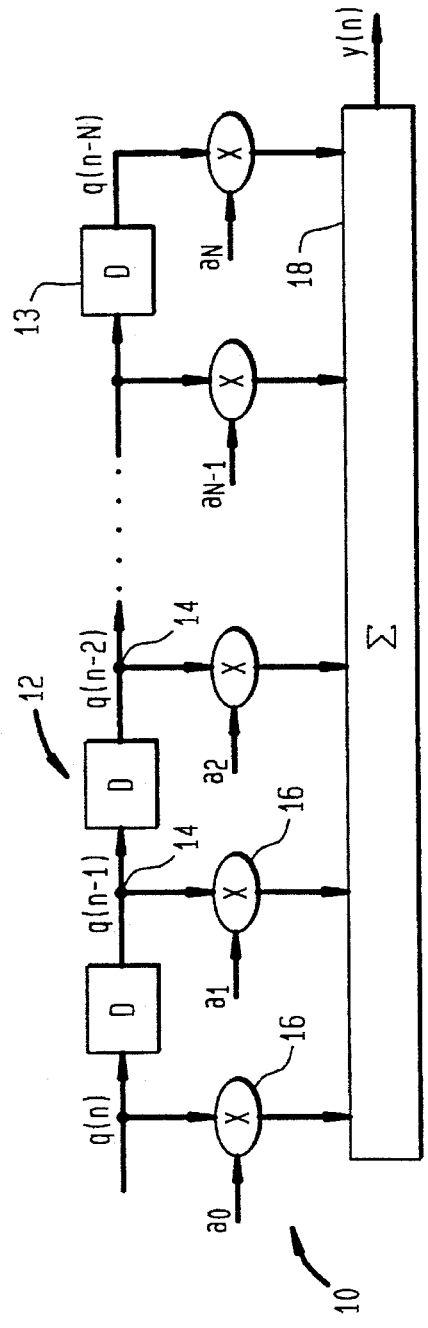
FIG. 1 schematically illustrates a first prior art linear transversal filter.
Figure 3:
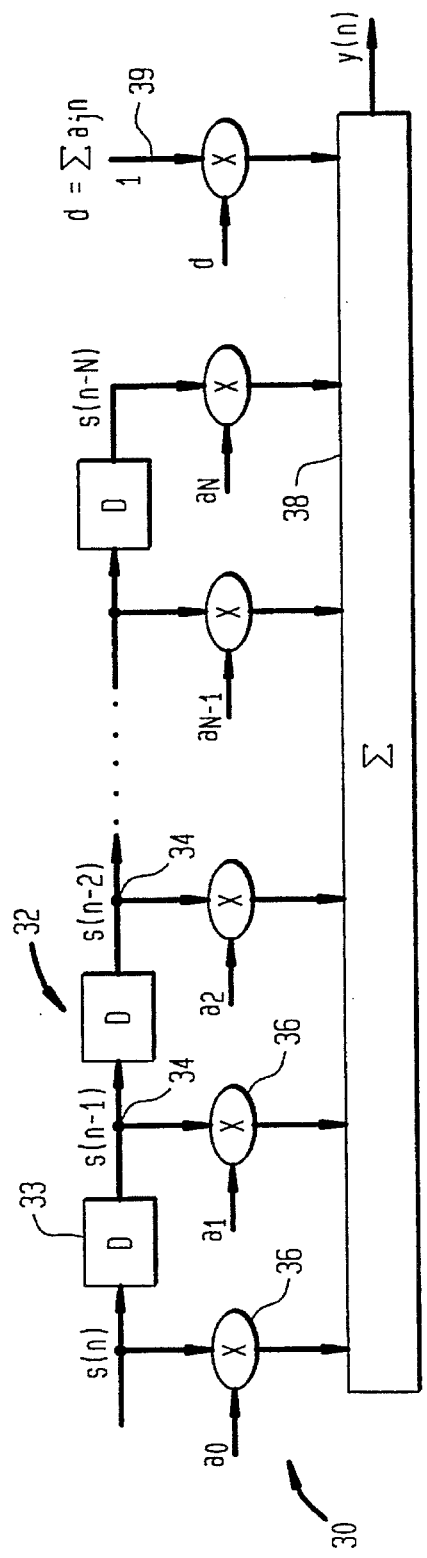
FIG. 3 schematically illustrates a second prior art linear transversal filter.
Figure 4:
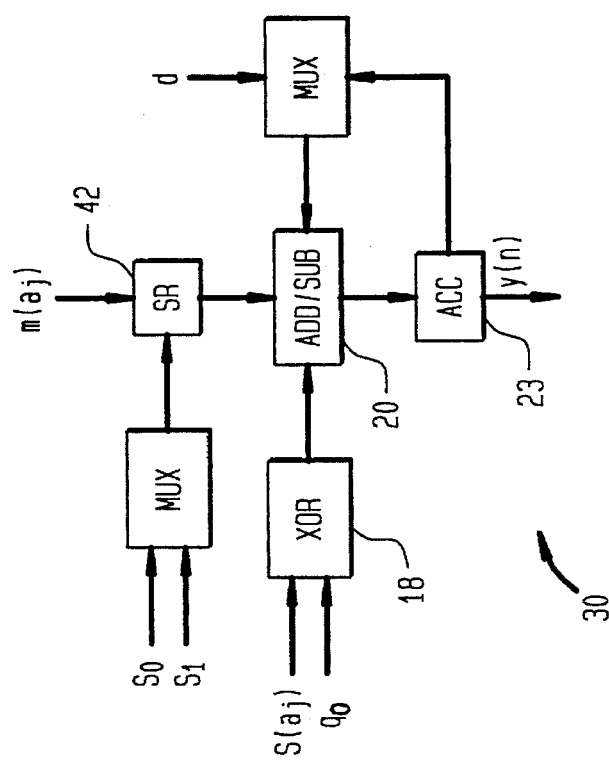
FIG. 4 schematically illustrates a hardware implementation of the filter of FIG. 3.
Figure 2:
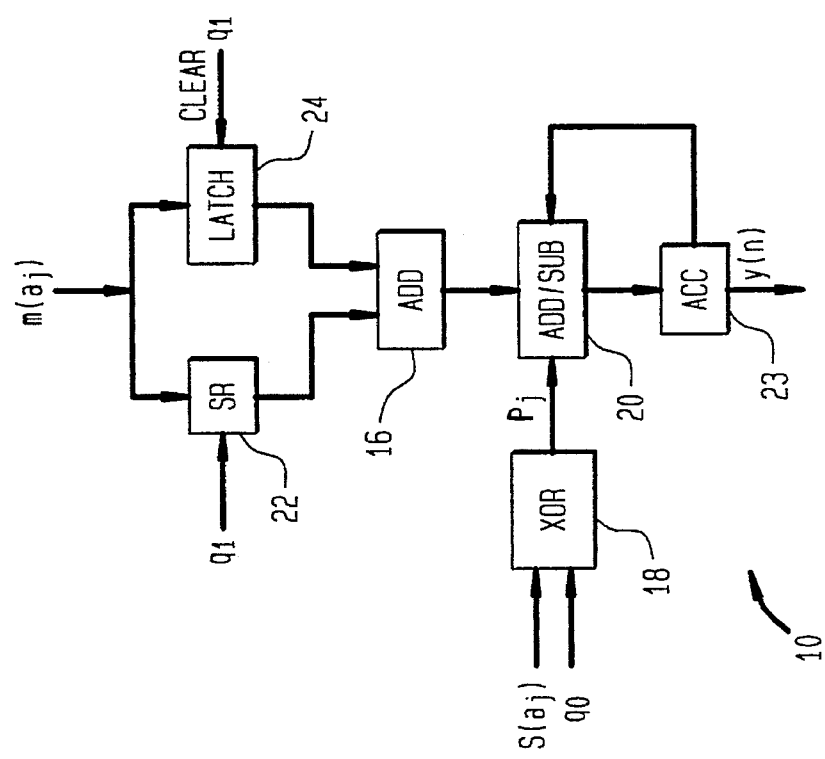
FIG. 2 schematically illustrates a hardware implementation of the filter of FIG. 1.
Figure 5:
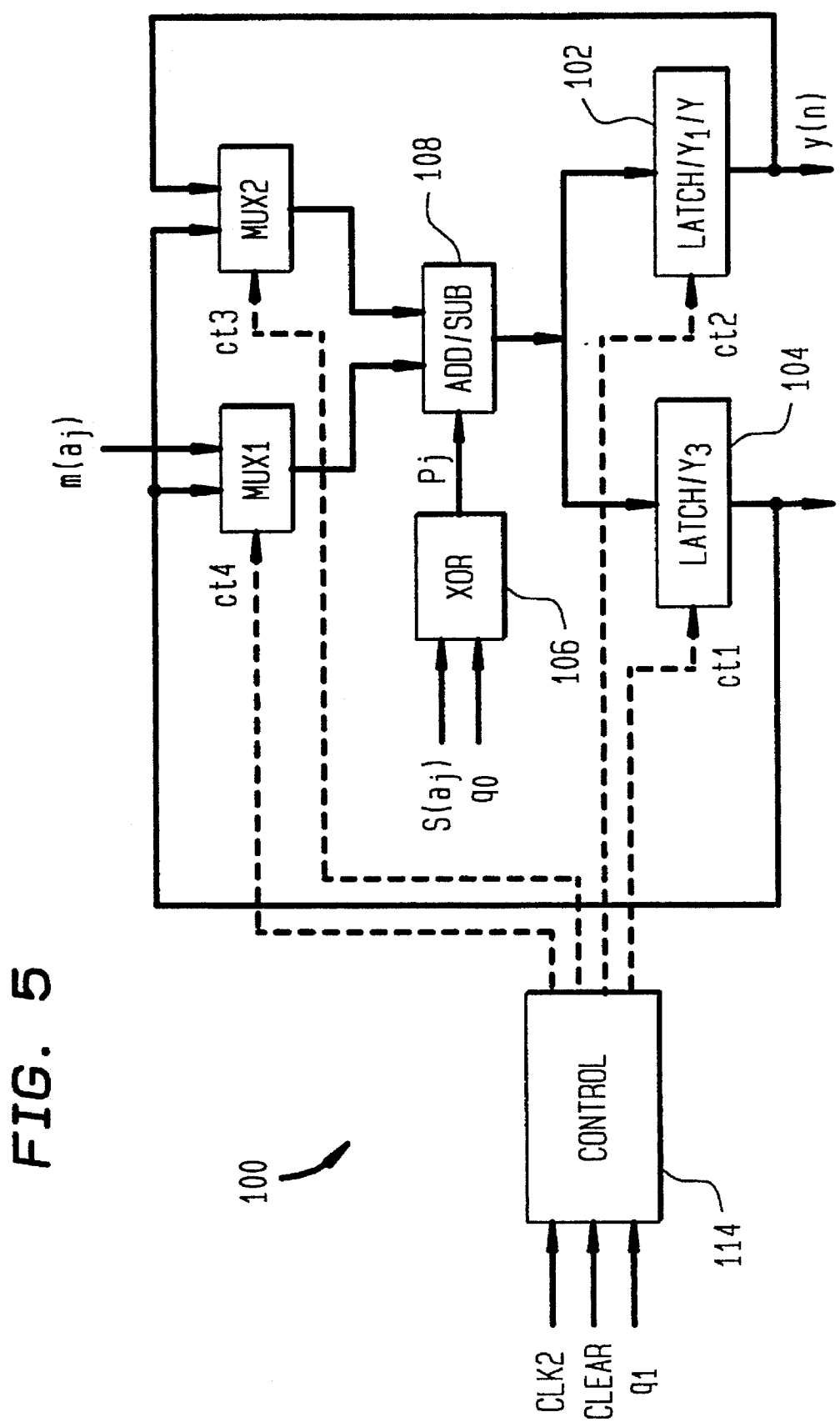
FIG. 5 illustrates a hardware implementation of a filter in accordance with a first embodiment of the invention.

A filter 100 in accordance with an illustrative embodiment of the invention is shown in FIG. 5. The inputs are the coefficient $a_j$ and the symbols $q(n-j)$. The filter 100 comprises an accumulator (or latch) 102 for storing the terms of the sum $y_1$, an accumulator (or latch) 104 for storing the terms of the sum $y_3$, an exclusive-or-gate 106 for outputting the bit $P_j$, an addition/subtraction circuit 108 which is controlled by the bit $P_j$, a first multiplexer MUX1, a second multiplexor MUX2, and a control circuit 114 whose input is $q_1$ the magnitude bit of the symbol $q(n-j)$. The filter 100 of FIG. 5 operates as follows:

Step 1.
 a) Clear accumulator 102 and accumulator 104.
 b) Input $q(n)$ and $a_o$.
 c) The control circuit 114 outputs the control signal ct4 to control MUX1. The magnitude $m(a_o)$ of $a_o$ is loaded into the addition/subtraction unit.
 d) The control line ct3 controls the MUX2. If $q_1=1$, then the contents of the $y_1$ accumulator 102 is loaded into the addition/subtraction unit 108 via MUX2. If $q_1=0$, then the contents of the $y_3$ accumulator 104 is loaded into the addition/subtraction unit 108 via MUX2.
 e) If at this point the magnitude of $q(n)$ is 1 ($q_1=1$), ct1 will be off, ct2 will be on and the output of the addition/subtraction unit will be loaded into the $y_1$ accumulator 102.
 f) If at this point, the magnitude of $q(n)$ is three ($q_1=0$), ct1 will be on, ct2 will be off, and the output of the addition/subtraction unit will be loaded into the $y_3$ accumulator 104.
 g) The sign bit of $a_0$, i.e., $s(a_0)$ and the sign bit of $q(n)$, i.e. $q_0$ are used to control the addition/subtraction unit 108. The bits $s(a_0)$ and $q_0$ are loaded into the exclusive-or-gate 106. The output of the exclusive-or-gate is $P_0=s(a_0)$ XOR $q_0$. (In general, when $P_j=1$, the unit 108 performs addition. When $P_j=0$, the unit 108 performs subtraction).

Step 2.
The sub-steps (b)–(g) of Step 1 are repeated for each coefficient $a_j$ and each corresponding symbol $q(n-j)$ (step (a) is not repeated as the accumulators 102, 104 are cleared only for j=0). After all the coefficients and symbols have been processed the accumulator 102 stores the sum $y_1$ and the accumulator 104 stores the sum $y_3$.

Step 3.
 a) Control line $ct_4$ loads the contents of the $y_3$ accumulator 104 to MUX1.
 b) Control line ct3 loads the contents of the $y_1$ accumulator 102 into MUX2.
 c) $s(a_j)$ and $q_0$ are assigned a zero value so that an addition is performed.
 d) Control line ct2 is on and control line ct1 is off. The output of the addition/subtraction unit is loaded into the $y_1$ accumulator 102 which now stores $y_1+y_3$.
 e) The sub-steps (a)–(d) of Step 3 are repeated two more times to obtain in the $y_1$ accumulator 102 $y_1+2y_3$ and then $y_1+3y_3=y(n)$.

Figure 6:
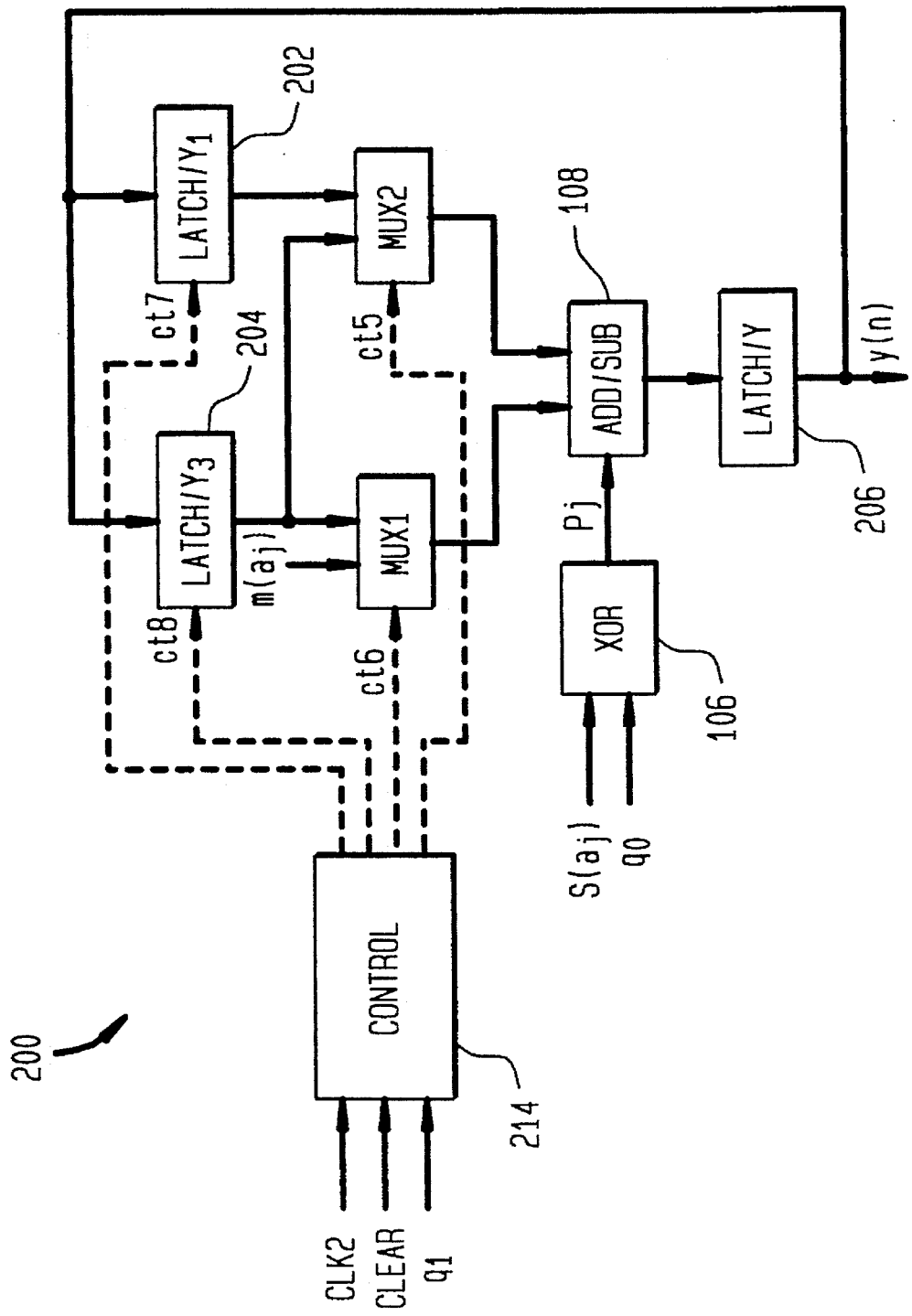
FIG. 6 illustrates a hardware implementation of a filter in accordance with a second embodiment of the invention.

An alternative filter according to the invention is illustrated in FIG. 6. The filter 200 of FIG. 6 comprises MUX1, MUX2, the addition/subtraction circuit 108, the exclusive-or-gate 106 and the control circuit 214. The inputs to the control circuit 214 include a clear signal and $q_1$ the magnitude bit of a symbol $q(n-j)$. The filter 200 also comprises a $y_1$ latch 202 for accumulating terms of the $y_1$ sum, a $y_3$ latch 204 for accumulating the terms of the $y_3$ sum and a y latch 206 for latching the output of the addition/subtraction circuit 108. The filter 200 of FIG. 6 operates as follows:

Step 1
 a) Clear the $y_3$ latch 204 and the $y_1$ latch 202.
 b) Input $q(n)$ and $a_0$.
 c) At this point, the control line ct6 controls MUX1 to load $m(a_0)$, the magnitude of $a_0$ to the addition/subtraction unit.
 d) The control line ct5 controls MUX2 to determine whether to load the output of the $y_1$ latch 202 or the $y_3$ latch 204 to the addition/subtraction unit 108.
 e) The addition/subtraction circuit then adds or subtracts the outputs of MUX1 and MUX2 and the result is stored in the y latch 206.
 f) If at this point, the magnitude of $q(n)$ is 1 ($q_1=1$), then ct7 will be on and ct8 will be off, and the output of the y latch 206 will be loaded to the $y_1$ latch 202.
 g) If at this point, the magnitude of $q(n)$ is three ($q_1=0$), then ct7 will be off and ct8 will be on, and the output of the y latch 206 will be loaded into the $y_3$ latch 204.
 h) The sign bit of $a_0$, i.e., $s(a_0)$ and the sign bit of $q(n)$, i.e., $q_0$, are used to generate $P_0$ to control the addition/subtraction unit 108 in the same manner as discussed above in connection with FIG. 5.

Step 2.
The sub-steps (b)–(h) of Step 1 are repeated until all of the coefficients $a_j$ and corresponding symbols are processed. (Note however that the $y_1$ and $y_3$ latches 202, 204 are not cleared). At this point the latch 202 stores the sum $y_1$ and the latch 204 stores the sum $y_3$.

Step 3.
 a) Control line ct6 loads the output of the $y_3$ latch 204 to the addition/subtraction unit 108 via MUX1.
 b) Control line ct5 loads the output of the $y_1$ latch 202 via MUX2 to the addition/subtraction unit 108.
 c) The inputs to the exclusive or gate 106 $s(a_j)$ and $q_0$ are assigned the value zero, so that addition is performed.
 d) The control line ct7 is on and ct8 is off. The output of the addition/subtraction unit 108 in the y latch 206 is loaded into the $y_1$ latch 202 to obtain $y_1+y_3$ in the $y_1$ latch.

Step 4.
The sub-steps (a), (b), (c), (d) of Step 3 are then repeated to obtain $y_1+2y_3$ in the $y_1$ latch.

Step 5.
The sub-steps (a), (b) and (c) of Step 3 are then repeated to obtain $y_1+3y_3=y(n)$ in the y latch 206.

In short an efficient filter for 2B1Q symbols has been disclosed. The filter may be used in a channel equalizer or an echo canceller.

Finally, the above describe embodiments of the invention are intended to be illustrative only. Numerous alternative embodiments may be devised by those skilled in the art without departing from the spirit and scope of the following claims.

We claim:
1. A filter method for evaluating convolutions of the form

$$y(n) = \sum_{j=0}^{N} a_j q(n-j)$$

where $a_j$ is a coefficient having a sign $s(a_j)$ and magnitude $m(a_j)$ and $q(n-j)$ is a 2B1Q symbol having a first bit $q_o$ in indicating the sign of $q(n-j)$ and a second bit $q_1$ indicating the magnitude of q(n–j), said filter method comprising the steps of:

(a) clearing a value stored in a first accumulator and a second accumulator, (b) determining $P_j = q_o$ XOR $s(a_j)$, where $q_o$ is the sign bit of the coefficient q(n–j), (c) determining whether an addition/subtraction unit performs an addition or substraction operation based on said bit $P_j$, and (d) in response to $P_j$, adding or subtracting $m(a_j)$ from said value stored in said first accumulator if $q_1$ has a first value and adding or subtracting $m(a_j)$ from said value stored in said second accumulator if $q_1$ has a second value, where $q_1$ is the magnitude bit q(n–j), (e) repeating said steps (b) to (d) for each of said coefficients $a_j$.

2. The method of claim 1 further comprising the step of, after $m(a_N)$ has been added or subtracted to the value stored in one of said accumulators, (f) adding the value stored in said second accumulator to the value stored in the first accumulator, and (g) repeating said step (f) a plurality of times.

3. The method of claim 2 wherein each of said symbols q(n–j) is chosen from the set (–3, –1, +1, +3).

4. The method of claim 3 wherein said plurality is three.

5. The method of claim 1, wherein said bit $P_j$ is determined using an exclusive-or-gate.

6. A filter for evaluating convolutions of the form $$y(n) = \sum_{j=0}^{N} a_j q(n-j)$$

where $a_j$ is a coefficient having a sign $s(a_j)$ and a magnitude $m(a_j)$ and q(n–j) is a symbol having a first bit $q_0$ indicating the sign of the symbol and a second bit $q_1$ indicating the magnitude of the symbol, said filter comprising an addition/subtraction unit, a first accumulator connected to receive an output of said addition/subtraction unit, and a circuit connected to determine whether said addition/subtraction unit performs an addition operation or a subtraction operation, said circuit being connected to output a signal to said addition/subtraction unit, for each coefficient $a_j$:

said circuit is connected to determine in response to $s(a_j)$ and the sign bit $q_o$ of the corresponding coefficient q(n–j) whether said addition/subtraction unit performs an addition or subtraction for each coefficient $a_j$, said addition/subtraction unit is connected to add or subtract $m(a_j)$ to a value stored in said first accumulator if the magnitude bit $q_1$ of q(n–j) is a first value.

said addition/subtraction unit is connected to add or subtract $m(a_j)$ to a value stored in said second accumulator if the magnitude bit $q_1$ of q(n–j) is a second value, and said addition/subtraction unit is connected to add a final value stored in said second accumulator to a final value stored in said first accumulator a plurality of times to obtain said final output value y(n).

7. The filter of claim 6 wherein said circuit is an exclusive-or-gate.

8. The filter of claim 7 wherein said symbols are 2B1Q symbols.

9. The filter of claim 8 wherein said first accumulator is a first latch and said second accumulator is a second latch.

* * * * *